US006983053B2

(12) United States Patent
Lee et al.

(10) Patent No.: US 6,983,053 B2
(45) Date of Patent: Jan. 3, 2006

(54) METHOD OF SELECTING A FREQUENCY BAND OF AN OUTPUT AUDIO SIGNAL BY A COMPUTER

(75) Inventors: Byeong-chang Lee, Yongin (KR); In-don Ju, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/601,810

(22) Filed: Jun. 24, 2003

(65) Prior Publication Data

US 2004/0122543 A1 Jun. 24, 2004

(30) Foreign Application Priority Data

Dec. 24, 2002 (KR) ..................... 10-2002-0083347

(51) Int. Cl.
*H03G 5/00* (2006.01)
*H02B 1/00* (2006.01)
*H04R 29/00* (2006.01)
*H04R 5/02* (2006.01)
*G06F 17/00* (2006.01)

(52) U.S. Cl. .......................... 381/99; 381/98; 381/123; 381/58; 381/59; 381/300; 381/306; 700/94

(58) Field of Classification Search ............ 381/98–99, 381/123, 58–59, 103, 300, 306–307; 700/94; 361/683, 686
See application file for complete search history.

(56) References Cited

U.S. PATENT DOCUMENTS 5,581,626 A * 12/1996 Palmer ....................... 381/103
5,847,922 A * 12/1998 Smith et al. ................ 361/683
6,148,243 A * 11/2000 Ishii et al. .................... 700/94
6,148,353 A * 11/2000 Cho ........................... 710/303
6,374,148 B1 4/2002 Dharmarajan et al.
6,687,379 B1 * 2/2004 Thiel ........................... 381/99
6,771,784 B2 * 8/2004 Murata ....................... 381/111

FOREIGN PATENT DOCUMENTS

JP 8-241148 9/1996
JP 9-274556 10/1997
JP 11-232075 8/1999
KR 10-156397 7/1998
KR 10-286374 1/2001

* cited by examiner

*Primary Examiner*—Laura A. Grier
(74) *Attorney, Agent, or Firm*—Staas & Halsey LLP

(57) ABSTRACT

A computing device allows selective output of audio signals within a frequency band. The computing device has a main system having an audio signal generator generating audio signals, a main audio outputting unit attached to the main system and outputting the generated audio signals, an auxiliary system connected to the main system and receiving the audio signals generated by the audio signal generating unit, and an auxiliary audio outputting unit attached to the auxiliary system and outputting the audio signals received in the auxiliary system A switching unit controls the audio signals to pass through a plurality of selectable filters filtering the audio signals within respective frequency bands and to supply the selected filtered audio signals to the main audio outputting unit, and to the auxiliary audio outputting unit, depending upon whether the auxiliary system is connected to the main system.

14 Claims, 3 Drawing Sheets

METHOD OF SELECTING A FREQUENCY BAND OF AN OUTPUT AUDIO SIGNAL BY A COMPUTER

CROSS-REFERENCE TO RELATED APPLICATIONS

This application claims the benefit of Korean Patent Application No. 2002-83347, filed Dec. 24, 2002, in the Korean Intellectual Property Office, the disclosure of which is incorporated herein by reference.

BACKGROUND OF THE INVENTION

1. Field of the Invention

The present invention relates, in general, to a computer system and, more particularly, to a computer system wherein a user can selectively output audio signals within a frequency band desired by him.

2. Description of the Related Art

These days, a computer system can process information composed of a mixture of a variety of medias, such as voices, characters, graphics, images, etc., in addition to word-processing or computing. In particular, a number of computer systems are equipped with sound cards outputting sounds. For example, the sound card converts sound data from the CD-ROM into audio data and outputs the audio data through the speaker.

Among the computer systems, to cope with the users' requests to make the main system of a notebook computer slimmer, a docking station to be connected to the main system has been widely used. Generally, a docking station is a hardware frame and a set of electrical connection interfaces that enable a notebook computer to effectively serve as a desktop computer. The docking station interfaces typically allow the notebook computer to communicate with a local printer, larger storage or backup drives, and possibly other devices that are not usually taken along with a notebook computer.

Recently, as the computer users have focused their interests in multimedia, there has been disclosed a docking station expanding sound output functions. An audio amplifier is installed within the docking station, and a low-pitched sound speaker is attached to the docking station, whereby the user can hear low-pitched sounds. However, in the conventional notebook computer system, the user can only hear a mean sound at the main system of the conventional notebook computer.

Next, an example process of outputting an audio sound from the notebook computer on which the docking station is mounted will be described in brief. For example, in the notebook computer, the sound data from a CD-ROM is converted into analog audio signals through a DAC (digital-to-analog converter) chip integrated within the sound card. The converted audio signals are amplified through an audio amplifier and then output to the speaker. Here, the speaker installed in the main system of the notebook computer is constructed to pass main frequency ingredients of the audio signals, thereby allowing the mean sound to be output at the main system.

Further, if the docking station is connected, audio signals can be transmitted to the docking station through a docking connector, and the transmitted audio signals are amplified through the audio amplifier of the docking station and output to the speaker installed in the docking station. Since a low-pitched sound speaker having no limitation in size and being large in diameter can be installed in the docking station, sounds of low frequency have generally been output at the docking station. However, this computer system configuration still has a limitation of outputting sounds of high frequency, even though the sound functions are supposed to have been expanded by the docking station. Further, the computer system does not allow selection of audio signal output according to a frequency band and/or controlling audio signal output location in the computer system.

SUMMARY OF THE INVENTION

Accordingly, the present invention provides a computer system wherein audio signals within a frequency band desired by a user, including a high-pitched sound as well as a low-pitched sound and a mean sound, can be output in a selective manner.

Additional aspects and/or advantages of the invention will be set forth in part in the description which follows and, in part, will be obvious from the description, or may be learned by practice of the invention.

The present invention can be achieved by providing a computer system comprising a main system having an audio signal generating unit generating audio signals, and a main audio outputting unit outputting the audio signals generated in the audio signal generating unit; and an auxiliary system, having an auxiliary system body, connected to the main system, receiving the audio signals generated from the audio signal generating unit, and an auxiliary audio outputting unit attached to the auxiliary system body, comprising a first filter provided in the main system, filtering the audio signals generated in the audio signal generating unit and supplying only a first frequency band as designated to the main audio outputting unit; a second filter provided in the auxiliary system, filtering the audio signals generated in the audio signal generating unit and supplying a second frequency band different from the first frequency band to the auxiliary audio outputting unit; a third filter provided in either of the main system or the auxiliary system, filtering the audio signals generated from the audio signal generating unit and supplying a third frequency band different from the first and the second frequency bands to either of the main audio outputting unit or the auxiliary audio outputting unit; and a switching unit allowing the audio signals to selectively pass through either of the first filter or the third filter and be supplied to the main audio outputting unit, and/or otherwise to selectively pass through either of the second filter or the third filter and be supplied to the auxiliary audio outputting unit, depending upon whether the auxiliary system is connected to the main system.

According to an aspect of the invention, the first filter is comprised of a band pass filter (BPF), the second filter is comprised of a low pass filter (LPF) and the third filter is comprised of a high pass filter (HPF).

According to an aspect of the invention, the switching unit comprises a switch allowing the audio signals to selectively pass through either of the first or third filters and be supplied to the main audio outputting unit, and/or otherwise to allow the audio signals to selectively pass through either of the second or third filters and be supplied to the auxiliary audio outputting unit; a sensing unit sensing whether the auxiliary system has been connected to the main system; and a controller controlling the switch so that the third filter is connected to either of the main audio outputting unit or the auxiliary audio outputting unit, if determined that the auxiliary system has been connected to the main system according to a connection sensing signal by the sensing unit.

According to an aspect of the invention, the controller controls the switch so that the third filter is connected to either of the main audio outputting unit or the auxiliary audio outputting unit, when an audio signal selection input as designated is provided in a state indicating that the auxiliary system is connected to the main system according to the connection sensing signal by the sensing unit.

According to an aspect of the invention, the controller is a logic element locally operating the connection sensing signal and a selection input signal generated according to the selection input.

According to an aspect of the invention, the audio signal selection is input via at least one of keyboard hot keys, a CMOS setup, and selection buttons.

The present invention may be also achieved by providing a computer system comprising a main system having an audio signal generating unit generating audio signals, and a main audio outputting unit outputting the audio signals generated in the audio signal generating unit; and an auxiliary system, having an auxiliary system body, connected to the main system, receiving the audio signals generated from the audio signal generating unit, and an auxiliary audio outputting unit attached to the auxiliary system body, comprising a first filter provided in the main system, filtering the audio signals generated in the audio signal generating unit and supplying only a first frequency band as designated to the main audio outputting unit; a second filter provided in the auxiliary system, filtering the audio signals generated in the audio signal generating unit and supplying a second frequency band different from the first frequency band to the auxiliary audio outputting unit; a third filter provided in the main system, filtering the audio signals generated from the audio signal generating unit and supplying a third frequency band different from the first and the second frequency bands to the main audio outputting unit; and a switching unit allowing the audio signals to selectively pass through either of the first filter or the third filter and be supplied to the main audio outputting unit, depending upon whether the auxiliary system is connected with the main system.

According to an aspect of the invention, the first filter is comprised of a band pass filter (BPF), the second filter is comprised of a low pass filter (LPF) and the third filter is comprised of a high pass filter (HPF).

According to an aspect of the invention, the switching unit comprises a switch allowing the audio signals to selectively pass through either of the first or third filters and be supplied to the main audio outputting unit; a sensing unit sensing whether the auxiliary system has been connected to the main system; and a controller controlling the switch so that the third filter is connected to the main audio outputting unit, if determined that the auxiliary system has been connected to the main system according to a connection sensing signal by the sensing unit.

According to an aspect of the invention, the controller controls the switch so that the third filter is connected to the main audio outputting unit, when a selection input as designated is provided in a state that the auxiliary system is connected to the main system according to the connection sensing signal by the sensing unit.

According to an aspect of the invention, the controller is a logic element locally operating the connection sensing signal and a selection input signal generated according to the selection input.

According to an aspect of the invention, the selection input comprises input via at least one of input by hot keys, input as established in a CMOS setup, and input by selection buttons as designated.

BRIEF DESCRIPTION OF THE DRAWINGS

The above and/or other aspects and advantages of the present invention will become apparent and more readily appreciated from the following description of the embodiments, taken in conjunction with the accompanying drawings of which.

DETAILED DESCRIPTION OF THE PREFERRED EMBODIMENTS

Figure 1:
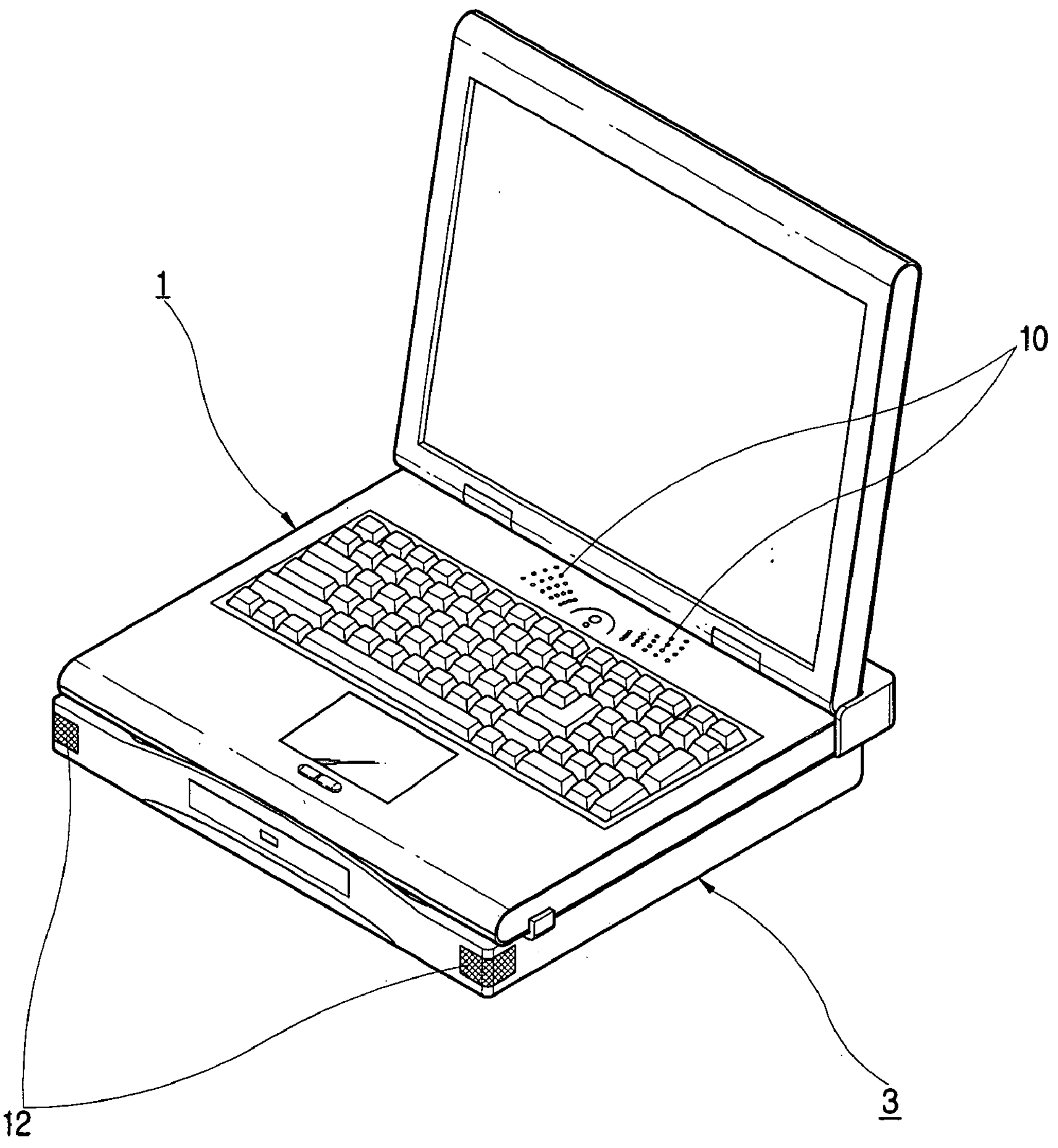
FIG. 1 is a schematic diagram of a computer system, according to an embodiment of the present invention.

Reference will now be made in detail to the embodiments of the present invention, examples of which are illustrated in the accompanying drawings, wherein like reference numerals refer to like elements throughout. The embodiments are described below in order to explain the present invention by referring to the figures.

FIG. 1 is a schematic diagram of a notebook (portable) computer connected to a docking station, as an example of a computer system, according to the present invention. As shown in FIG. 1, the computer system comprises a main computer body as a main system 1, assembled to an LCD part by a hinge, and in which a central processing unit (CPU), a video chip, a sound card, a hard disk (data storage) of a small capacity, all of which are not shown, and a speaker 10 are installed. The main system 1 is provided with a docking port (not shown) on an outer rear plate surface thereof, and a docking station 3 is detachably mounted by the docking port (not shown) on the main system 1. Typically, the docking station 3 is an auxiliary system supporting/expanding a multimedia function and an expansion function of the data storage device, of the main system 1. Within the docking station 3 is installed a speaker 12 sufficiently large in diameter to output low-pitched sound, in addition to an additional hard disk drive and optical reading/writing devices, such as CD-ROM/RW/DVD and so on, (not shown) for expanding the data storage and the multimedia function of the main system 1.

Figure 2:
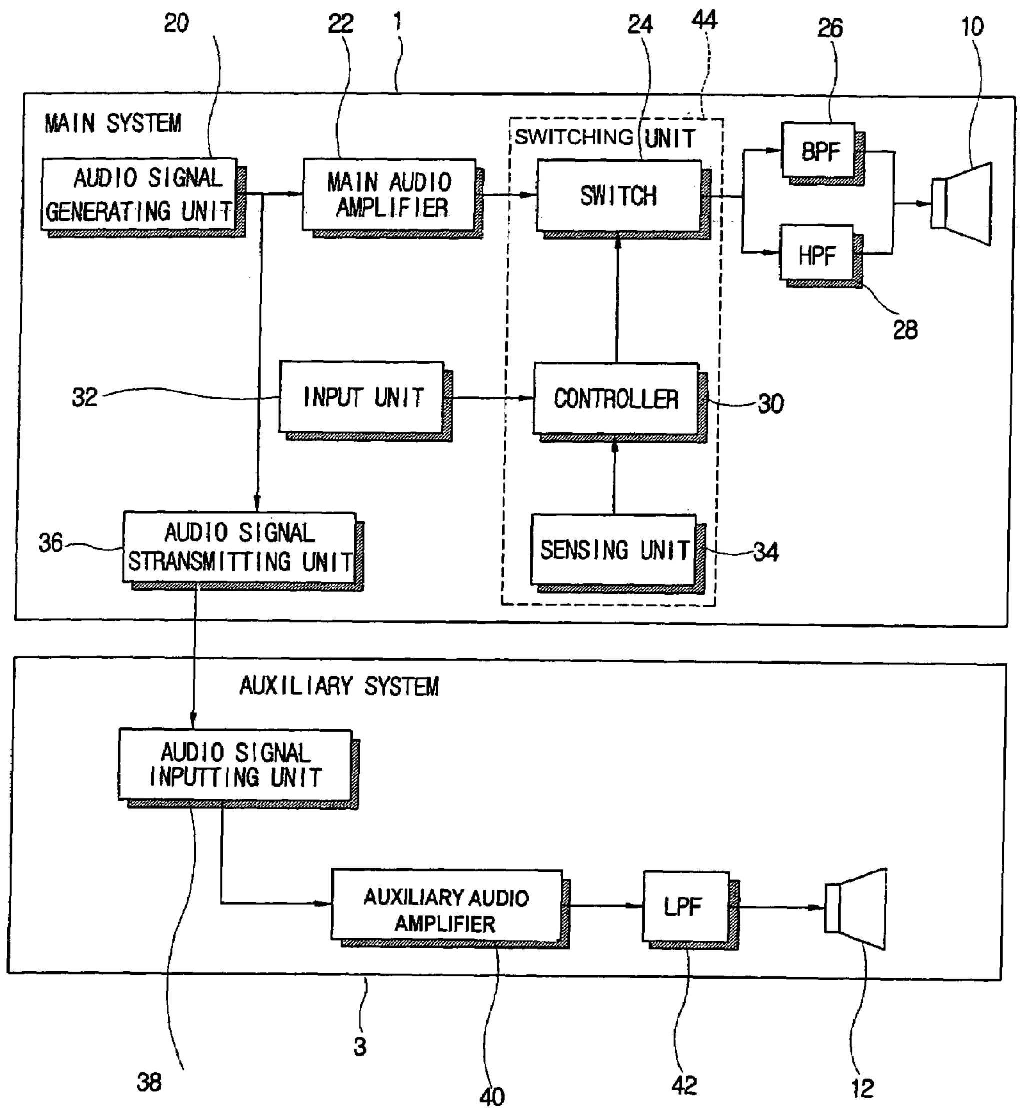
FIG. 2 is a control block diagram of the computer system shown in FIG. 1, according to an embodiment of the present invention.

FIG. 2 is a control block diagram of the computer system shown in FIG. 1 according to an embodiment of the present invention. The main system 1 comprises an input unit 32 with which the user is allowed to input a selection of filters, an audio signal generating unit 20 generating audio signals, a main audio amplifier 22 amplifying audio signals generated from the audio signal generating unit 20, and an audio signal transmitting unit 36 transmitting the audio signals to the docking station 3.

The main system 1 further comprises a band pass filter (BPF) 26 passing only a designated frequency band of the audio signals amplified through the main audio amplifier 22, thereby providing a mean sound, and a high pass filter (HPF) 28 passing only signals of high frequency. A switching unit 44 can switch between the BPF 26 and the HPF 28, for example, according to a user selection input through the input unit 32 while the docking station 3 is connected to the main system 1. Therefore, in response to an input selection, the switching unit 44 allows the audio signals to pass through either the BPF 26 or the HPF 28 to be supplied to a main audio outputting unit 10, which typically is a speaker unit.

The docking station 3 as an auxiliary system is a station body connected to the main system 1. The docking station 3 comprises an audio signal inputting unit 38 receiving an input of the audio signals of the main system 1, an auxiliary audio amplifier 40 amplifying the audio signals input from the audio signal inputting unit 38, a low pass filter (LPF) 42 passing only signals of low frequency from among the amplified audio signals, and an auxiliary audio outputting unit 12, which is typically a speaker unit, outputting the filtered audio signals.

The audio signal generating unit 20 processes digital sound data input through an input channel (not shown), and the processed digital sound data is supplied to the main audio amplifier 22 after being converted into analog signals through a codec (not shown). The audio signals amplified through the main audio amplifier 22 pass via the switching unit 44 through either the BPF 26 or the HPF 28 and then output through the speaker 10 as the main audio outputting unit 10. If the docking station 3 is connected to the main system 1, typically the audio signals generated from the audio signal generating unit 20 are also transmitted to the docking station 3 through the audio signal transmitting unit 36.

The docking station 3 receives the audio signals output by the main system 1 through the audio signal inputting unit 38. The received audio signals by the docking station 3 are amplified through the auxiliary audio amplifier 40 and then supplied to the LPF 42. The LPF 42 allows only the audio signals of a low frequency to pass, outputting the low frequency audio signals to the speaker 12 as the auxiliary audio outputting unit 12. Through these processes, low-pitched sound is output at the docking station 3.

Accordingly, in contrast to the docking station 3, the main system 1 can output mean sound or high-pitched sound because of the BPF 26 and the HPF 28. The BPF 26 is a filter passing only ingredients of a pass band frequency as wide as a band width desired by the user, thereby passing a mean sound of audio signals amplified through the main audio amplifier 22. On the other hand, the HPF 28 is a filter passing only signals beyond a desired cut-off frequency, thereby passing only a high-pitched sound of the audio signals. The BPF 26 and the HPF 28 may be constructed with a resistor (resistance), a capacitor (capacitance) and so on, as hardware units, which may be realized with the use of any software for that purpose.

According to the invention, the BPF 26 and the HPF 28 can be selectively switched by the switching unit 44. The switching unit 44 comprises a switch 24 selectively switching the BPF 26 or the HPF 28, a sensing unit 34 sensing a connection of the docking station 3 to the computer body 1, and a controller 30 controlling the switch 24 according to an input selection, for example, a selection input by a user through the input unit 32 while the docking station 3 is connected to the computer body 1.

The switch 24 switches in response to a control signal from the controller 30. According to an aspect of the present invention, the switch 24 comprises an electronic switch, such as a transistor. According to the switching operation by the switch 24, the main system 1 can selectively output the mean sound or the high-pitched sound via the BPF 26 and the HPF 28, respectively.

The sensing unit 34 is a sensor sensing the connection of the docking station 3 to the computer body 1. Typically, the docking port (not shown) provided in the computer body 1 performs sensing functions as the sensing unit 34. That is, the docking port of the computer body 1 generates a connection sensing signal (connection signal) sensing connection when the docking station 3 is connected to the docking port. The controller 30 determines whether the docking station 3 is connected to the docking port according to the connection sensing signal generated by the sensing unit 34. If it is determined that the docking station 3 is connected to the computer body 1, the controller 30 controls the switch 24 according to an input selection signal, for example, a selection input by a user through the input unit 32 to switch audio signal filtering between either the BPF 26 or the HPF 28 to output either a mean sound or a high-pitched sound, respectively. As a result, for example, the high-pitched sound can be selectively output at the main system 1, thereby complementing the low frequency audio signals (low-pitched sound) output at the docking station 3.

If it is determined that the docking station 3 is not connected with the docking port of the computer body 1, the controller 30 controls the switch 24 to switch audio signal filtering to the BPF 26. As a result, the audio signals having the mean sound are output to the main audio outputting unit 10 as generally output in a conventional notebook computer system not connected to a docking station.

According to an aspect of the present invention, the controller 30 is a logic element logically operating the connection sensing signal by the sensing unit 34 and the selection signal input by the user, and outputting a control signal to the switch 24. For example, if the connection sensing signal and an input HPF selection signal by the user are signals of LOW_ACTIVE, the controller 30 may be constructed so that a LOW signal is output to the switch 24 using a logic element, such as an OR gate. In particular, the switch 24 is constructed to receive the LOW signal by the OR gate, thereby selecting the HPF 28 to output a high-pitched sound.

According to an aspect of the present invention, the input unit 32 comprises a keyboard, a mouse or a touch pad of the computer system, or buttons inputting a selection as provided in the computer body 1 or the docking station 3. As any selection is input through the input unit 32, either the BPF 26 or the HPF 28 is selected, thereby providing an audio-signal frequency selection. According to an aspect of the invention, the audio-signal frequency selection can be made via hot keys on the keyboard. In addition, any audio-signal frequency selection may be established as a DEFAULT CMOS setup and/or setup by the user on a display for the CMOS setup, or input by pressing selection buttons separately provided.

According to the present invention, if the docking station 3 is connected to the main system 1, the low-pitched sound is output in the docking station 3 and the mean sound, or the high-pitched sound, can be selectively output in the main system 1. Therefore, the computer system according to the present invention overcomes the limitation of conventional computer systems unable to output an available high-pitched sound when using an auxiliary sound expanding system.

Figure 3:
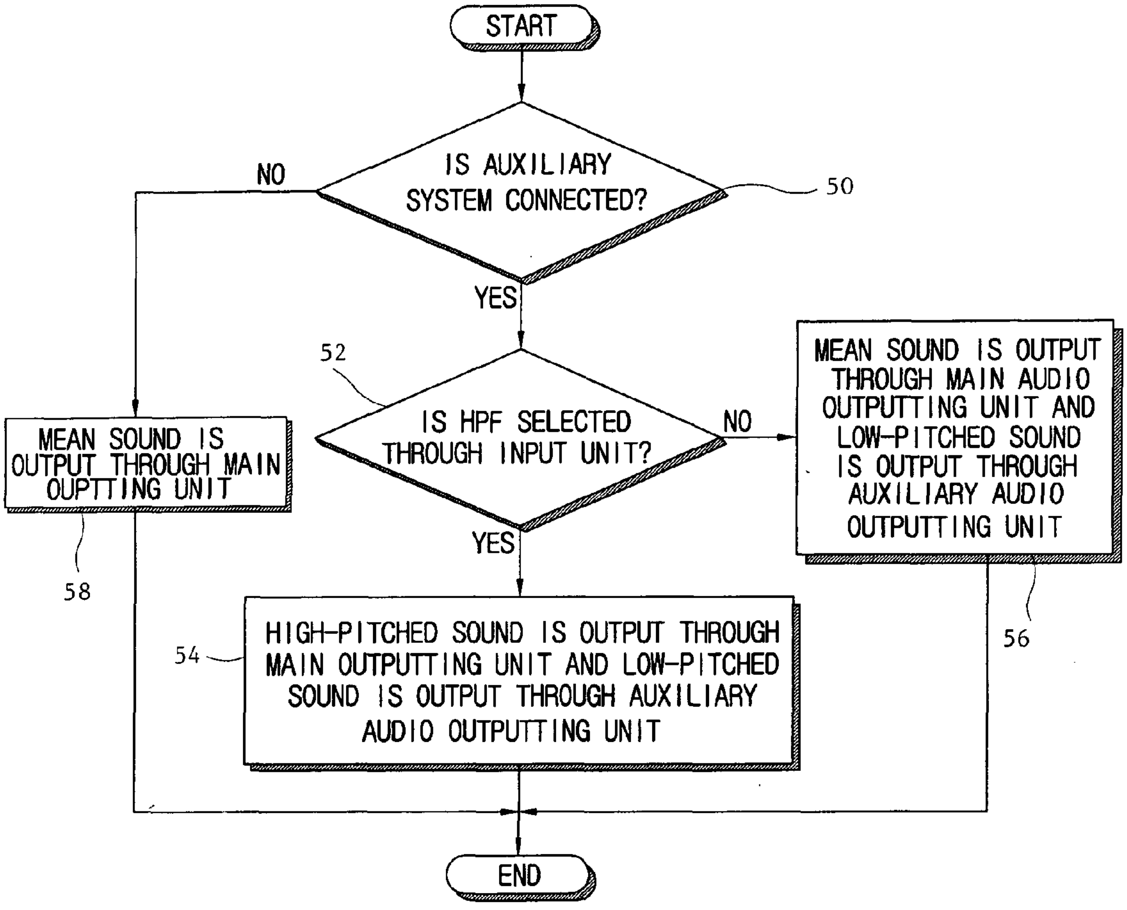
FIG. 3 is a flow chart of controlling the computer system of FIG. 2, according to an embodiment of the present invention.

FIG. 3 is a flow chart of controlling the computer system shown in FIG. 2, according to an embodiment of the present invention. At operation 50, the controller 30 of the main system 1 receives a connection signal, sensing a connection of the docking station 3, from the sensing unit 34 and determines whether the docking station 3 has been connected. If, at operation 50, it is determined that the docking station 3 is connected to the main system 1 of the computer system, at operation 52, the controller 30 receives a signal corresponding to a selection, for example, a selection input by a user through the input unit 32, and determines whether the signal selects the HPF 28. If, at operation 52, the HPF 28 is selected, at operation 54, the high-pitched sound is output through the main audio outputting unit 10 and the low-pitched sound is output via the LPF 42 through the auxiliary audio outputting unit 12, according to the connection signal sensing the connection of the docking station 3 and the input selection signal selecting the HPF 28. If, at operation 52, the HPF 28 is not selected, at operation 56, although the connection of the docking station 3 to the main system 1 has been sensed, the mean sound and the low-pitched sound are output via the output units 10 and 12, respectively, as in a conventional computer system with a connected docking station having a sound expansion function.

However, if, at operation 50, it is determined that the docking station 3 has not been connected to the main system 1, at operation 58, the mean sound is output through the main audio outputting unit 10 as in a conventional computer system not using a docking station With the computer system of the present invention, the user can selectively listen to either the mean sound or the high-pitched sound according to a selection signal input by the user, if the main body of the computer system is connected to the docking station. In the above-described embodiment, although the first filter is the BPF 26, the second filter is the LPF 42 and the third filter is the HPF 28, the present invention is not limited to such a configuration, and, for example, the first to third filters are interchangeable between the main computer body and the docking station of the computer system, and other audio signal filter configurations with corresponding switches can be provided, as desired according to application. For example, in the above-described embodiment, although the BPF 26 and the HPF 28 are selectively switched in the main system 1, it is possible to construct an auxiliary system 3 wherein the BPF 26 and the HPF 28 are selectively switched therein. Otherwise, the HPF 28 and the LPF 42 can also be selectively switched by providing the HPF 28 in the auxiliary system 3.

Further, although in the embodiment described above, the docking station 3 is connected to the computer body 1 and the switch switches to the third filter in response to a selection input by the user, according to an aspect of the invention, the switch can automatically switch to the third filter once the docking station 3 is connected to the computer body 1. If the docking station 3 is connected to the main computer body 1, typically the audio signal filters as embodied in software pass different frequency bands of audio signals, as established by the user. Further, in the above-described embodiment, although the audio filters respectively passing different frequency bands are separate from the speaker, the present invention is not limited to such a configuration and the audio filters may be replaced with speakers passing different frequency bands.

Further in the embodiment described above, although the controller 30 is a logic element, the controller 30 can be a microcomputer (i.e., a programmed processor) controlling the switch 24 according to the connection signal sensing the connection of the docking station 3 and the selection signal input by the user. The above embodiment has been described in connection with a docking station, which as an auxiliary system to the main computer body 1, may comprise any auxiliary component, such as expansion ports, such as an UltraBase, and so on.

The computer system according to the present invention can selectively output audio signals in different frequency bands by allowing the audio filters passing different frequency bands to be selectively switched, for example, as desired by a user, or according to a pre-set configuration. More particularly, the present invention is directed to a computing device having a main system, an auxiliary system in communication with the main system and a switching unit controlling generated audio signals to pass through a plurality of selectable filters filtering the audio signals within a frequency band and to supply the selected filtered audio signals to a main audio outputting unit of the main system and/or to an auxiliary audio outputting unit of the auxiliary system, depending upon whether the auxiliary system is connected to the main system. The switching unit may be provided in either the main system or the auxiliary system depending upon application. Accordingly, the present invention provides a computer system, comprising a main audio system processing sound, an auxiliary audio system processing sound when in communication with the main audio system, a plurality of selectable filters in the main and the auxiliary audio systems and filtering generated audio signals within respective frequency bands, and a switch allowing the audio signals to pass through the filters to supply the selected filtered audio signals to the main audio system and/or to the auxiliary audio system, depending upon whether the auxiliary audio system is communicating with the main audio system. In particular, the switch further comprises a sensor sensing whether the auxiliary audio system is communicating with the main audio system, a plurality of filters in the main and the auxiliary audio systems and filtering generated audio signals within respective frequency bands, and a controller controlling input to the filters in response to the sensor and input filter selection to control sound output according to the filter selection at the main and auxiliary audio systems.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A computer system including a main system having an audio signal generating unit generating audio signals, a main audio outputting unit in communication with the main system and outputting the generated audio signals, an auxiliary system connected to the main system and receiving the generated audio signals, and an auxiliary audio outputting unit in communication with the auxiliary system and outputting the generated audio signals received in the auxiliary system, the computer system comprising:

a first filter provided in the main system, filtering the audio signals generated in the audio signal generating unit and supplying only a first frequency band as designated to the main audio outputting unit;

a second filter provided in the auxiliary system, filtering the audio signals generated in the audio signal generating unit and supplying a second frequency band different from the first frequency band to the auxiliary audio outputting unit;

a third filter provided in either of the main system or the auxiliary system, filtering the audio signals generated from the audio signal generating unit and supplying a third frequency band different from the first and the second frequency bands to either of the main audio outputting unit or the auxiliary audio outputting unit; and a switching unit switching the audio signals to selectively pass through either the first filter or the third filter and be supplied to the main audio outputting unit, and to selectively pass through either the second filter or the third filter and be supplied to the auxiliary audio outputting unit, depending upon whether the auxiliary system is connected to the main system.

2. The computer system according to claim 1, wherein the first filter is a band pass filter (BPF), the second filter is a low pass filter (LPF) and the third filter is a high pass filter (HPF).

3. The computer system according to claim 1, wherein the switching unit comprises:

a switch performing the switching;

a sensing unit sensing whether the auxiliary system is connected to the main system; and a controller controlling the switch so that the third filter is connected to either the main audio outputting unit or the auxiliary audio outputting unit, depending upon whether the auxiliary system is connected to the main system according to the sensing unit.

4. The computer system according to claim 3, wherein the controller controls the switch so that the third filter is connected to either the main audio outputting unit or the auxiliary audio outputting unit, depending upon whether an audio signal frequency band selection is input in a state indicating that the auxiliary system is connected to the main system according to the sensing unit.

5. The computer according to claim 4, wherein the controller is a logic element locally operating in response to a connection sensing signal by the sensing unit and the input audio signal frequency band selection.

6. The computer system according to claim 4, wherein the audio signal frequency band selection is input via at least one of keyboard hot keys, a CMOS setup, and selection buttons.

7. The computer system according to claim 2, wherein the switching unit comprises:

a switch performing the switching;

a sensing unit sensing whether the auxiliary system is connected to the main system; and a controller controlling the switch so that the third filter is connected to either the main audio outputting unit or the auxiliary audio outputting unit, depending upon whether the auxiliary system is connected to the main system according to the sensing unit.

8. The computer system according to claim 7, wherein the controller controls the switch so that the third filter is connected to either the main audio outputting unit or the auxiliary audio outputting unit, depending upon whether an audio signal frequency band selection is input in a state indicating that the auxiliary system is connected to the main system according to the sensing unit.

9. The computer according to claim 8, wherein the controller is a logic element locally operating in response to a connection sensing signal by the sensing unit and the input audio signal frequency band selection.

10. The computer system according to claim 8, wherein the audio signal frequency band selection is input via at least one of keyboard hot keys, a CMOS setup, and selection buttons.

11. A computer system, comprising:

a main audio system processing sound;

an auxiliary audio system processing sound when in communication with the main audio system;

a plurality of selectable filters in the main and the auxiliary audio systems and filtering generated audio signals within different respective frequency bands for each of the plurality of the selectable filters to be supplied to the main and auxiliary audio systems; and a switch controlling the audio signals to pass through selected filters to supply selected filtered audio signals to the main audio system and/or to the auxiliary audio system, depending upon whether the auxiliary audio system is communicating with the main audio system.

12. The computer system of claim 11, wherein the filters comprise a band pass filter (BPF), a low pass filter (LPF) in the auxiliary system, and a high pass filter (HPF), and wherein the BPF and the HPF are provided interchangeably in the main audio and/or the auxiliary audio systems and the switch controls the audio signals to pass through the LPF and the HPF depending upon whether the auxiliary audio system is communicating with the main audio system.

13. The computer system of claim 11, wherein the auxiliary audio system is provided in a docking station for the computer system.

14. An audio signal frequency band switch unit in a computer having a main audio system and an auxiliary audio system, the switch unit comprising:

a sensor of the switch unit sensing whether the auxiliary audio system is communicating with the main audio system;

a switch of the switch unit for switching a plurality of filters in the main and the auxiliary audio systems and filtering generated audio signals within different respective frequency bands for each of the plurality of the selectable filters to be supplied to the main and auxiliary audio systems; and a controller of the switch unit controlling input to the filters, in response to the sensor and input filter selection to control sound output according to the filter selection at the main and auxiliary audio systems.

* * * * *